US011038100B1

(12) United States Patent
Guo (10) Patent No.: US 11,038,100 B1
(45) Date of Patent: Jun. 15, 2021

(54) MAGNETORESISTIVE ELEMENT HAVING A PERPENDICULAR AFM STRUCTURE

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 64 days.

(21) Appl. No.: 16/695,183

(22) Filed: Nov. 26, 2019

Related U.S. Application Data

(63) Continuation-in-part of application No. 14/073,844, filed on Nov. 6, 2013, now Pat. No. 10,522,589.

(51) Int. Cl.
*H01L 43/10* (2006.01)
*H01L 43/02* (2006.01)

(52) U.S. Cl.
CPC ............. *H01L 43/10* (2013.01); *H01L 43/02* (2013.01)

(58) Field of Classification Search
CPC ................................. H01L 43/10; H01L 43/02
See application file for complete search history.

(56) References Cited

U.S. PATENT DOCUMENTS

| 2007/0121373 | A1* | 5/2007 | Koga | G11C 11/15 365/158 |
| 2014/0306302 | A1* | 10/2014 | Jan | H01F 10/3272 257/421 |
| 2017/0084829 | A1* | 3/2017 | Lee | G11C 11/161 |
| 2017/0222132 | A1* | 8/2017 | Pinarbasi | H01L 43/12 |

* cited by examiner

*Primary Examiner* — Fernando L Toledo
*Assistant Examiner* — Neil R Prasad (57) ABSTRACT

A magnetoresistive element comprises a perpendicular coupling layer between a novel perpendicular AFM layer and ferromagnetic recording layer. The perpendicular coupling layer introduces giant magnetic anisotropy energies (P-MAE) on the recording layer interface and the P-AFM layer interface which further introduce RKKY coupling between the magnetic moment of the recording layer and the P-MAE induced magnetic moment at the P-AFM layer interface, yielding a giant perpendicular magnetic anisotropy of the recording layer.

18 Claims, 6 Drawing Sheets

FIG. 1

Prior Art

MAGNETORESISTIVE ELEMENT HAVING A PERPENDICULAR AFM STRUCTURE

BACKGROUND OF THE INVENTION

1. Field of the Invention

This invention relates to the field of magnetoresistive elements. More specifically, the invention comprises spin-transfer-torque magnetic-random-access memory (MRAM) using magnetoresistive elements as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current along a specific direction to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong perpendicular magnetic anisotropy induced by both interface interaction and crystalline structure (shape anisotropies are not used), and accordingly, the device shape can be made smaller than that of an in-plane magnetization type. Also, variance in the easy axis of magnetization can be made smaller. Accordingly, by using a material having a large perpendicular magnetic anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and an MgO cap layer that sandwich a magnetic recording layer having a pair of amorphous CoFeB ferromagnetic layers and a Boron-absorbing layer positioned between them, and accelerate crystallization of the amorphous ferromagnetic film to match interfacial grain structure to MgO layers through a thermal annealing process. The recording layer crystallization starts from both the tunnel barrier layer side and the cap layer side to its center and forms a CoFe grain structure having a perpendicular magnetic anisotropy, as Boron elements migrate into the Boron-absorbing layer. Accordingly, a coherent perpendicular magnetic tunneling junction structure is formed. By using this technique, a high MR ratio can be achieved.

However, when an MTJ CD size is reduced to meet needs of very advanced and small technology nodes, both MgO tunnel barrier layer and MgO cap layer need to be thinner to keep a reasonable MTJ resistance. Consequentially, it becomes more difficult to achieve both a high perpendicular magnetic anisotropy in the recording layer and a high MR ratio in an MTJ element in order to maintain a good thermal stability and read/write performance.

A thick Boron-absorbing layer may help improve the perpendicular magnetic anisotropy in the recording layer. But, the damping constant of the recording layer may also increase from the thick Boron-absorbing layer material diffusion during the heat treatment in the device manufacturing process. In a spin-injection MRAM, a write current is proportional to the damping constant and inversely proportional to a spin polarization. Therefore, it is desired to develop new technologies to greatly enhance perpendicular magnetic anisotropy while keeping a high MR ratio.

BRIEF SUMMARY OF THE PRESENT INVENTION

The present invention comprises perpendicular magnetoresistive elements and methods of manufacturing such perpendicular magnetoresistive elements for perpendicular spin-transfer-torque MRAM.

The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The perpendicular magnetoresistive element comprises: a reference layer having magnetic anisotropy in a direction perpendicular to a film surface and having an invariable magnetization direction; a tunnel barrier layer on the reference layer; a recording layer having magnetic anisotropy in a direction perpendicular to a film surface and having a variable magnetization direction on the tunnel barrier layer; a perpendicular coupling (P-C) layer on a surface of the recording layer and a novel perpendicular anti-ferromagnetic (P-AFM) layer provided on a surface of the P-C layer, wherein the P-C layer introduces giant magnetic anisotropy energies (P-MAE) on the top surface of the recording layer and the bottom surface of the P-AFM layer which further introduce RKKY coupling between the magnetic moment of the recording layer and the P-MAE induced magnetic moment at the bottom of the P-AFM layer, yielding a giant perpendicular magnetic anisotropy of the recording layer.

In a special case when the P-C layer is made of a thin MgO film, the giant P-MAE can been achieved for the transition metal atoms (at top surface of the recording layer and at bottom surface of the P-AFM layer) sitting on the top of the O sites of MgO (001) surface through a giant spin-orbit coupling (SOC) energy, a special ligand field and a large orbit moment. Since the P-MAE may approach the magnetic anisotropy limit of a 3d or 4d transition atom, magnetic moments of these transition atoms from two interfaces are coupled across the thin MgO film.

As an amorphous ferromagnetic material, like CoFeB, in the recording layer is thermally annealed, a crystallization process occurs to form bcc CoFe grains having epitaxial growth with (100) plane parallel to the surface of the tunnel barrier layer to form a perpendicular magnetic crystalline anisotropy as Boron elements migrate into the Boron-absorbing layer. Having a giant P-MAE, a perpendicular magnetic crystalline anisotropy becomes less important. A CoFeB layer with less Boron percentage requires a thinner Boron-absorbing layer, resulting a recording layer having a low damping constant and a reduced write current is achieved.

DETAILED DESCRIPTION OF THE INVENTION

In general, according to one embodiment, there is provided a magnetoresistive element comprising:

a reference layer having magnetic anisotropy and having an invariable magnetization direction;

a tunnel barrier layer provided on the reference layer;

a recording layer provided on the tunnel barrier layer and having a variable magnetization direction;

a perpendicular coupling (P-C) layer provided on top surface of the recording layer;

a perpendicular anti-ferromagnetic (P-AFM) layer provided on top surface of the P—C layer, wherein the P-C layer introduces giant magnetic anisotropy energies (P-MAE) on the top surface of the recording layer and the bottom surface of the P-AFM layer which further introduce RKKY coupling between the magnetic moment of the recording layer and the P-MAE induced magnetic moment at the bottom of the P-AFM layer, yielding a giant perpendicular magnetic anisotropy of the recording layer;

a cap layer provided on top surface of the P-AFM layer;

and an upper-contact multilayer provided on the cap layer, comprising a buffer layer and a photoresist layer for further photo-lithographic processes of a magnetoresistive element.

Figure 1:
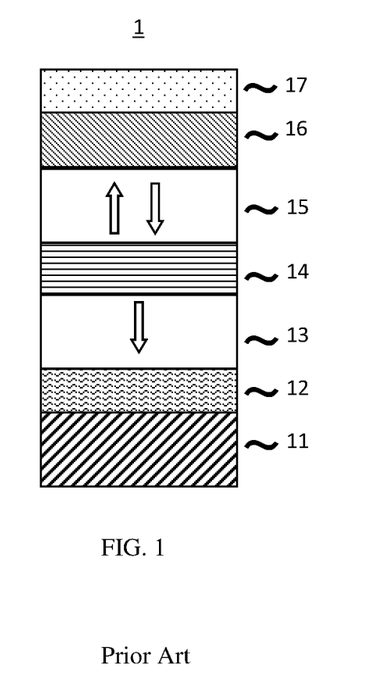
FIG. 1 is a cross-sectional view showing a schematic configuration of an MTJ element 1 as a prior art.

FIG. 1 is a cross-sectional view showing a configuration of an MTJ element 1 as a prior art. The MTJ element 1 is configured by stacking a bottom electrode 11, a seed layer 12, a reference layer 13, a tunnel barrier layer 14, a recording layer 15, a cap layer 16, and a protective layer 17 in this order from the bottom.

The reference layer 13 and the recording layer 15 are made of a ferromagnetic material, and have uni-axial magnetic anisotropy in a direction perpendicular to a film surfaces. Further, directions of easy magnetization of the reference layer 13 and the recording layer 15 are also perpendicular to the film surfaces. In another word, the MTJ element 1 is a perpendicular MTJ element in which magnetization directions of the reference layer 13 and the recording layer 15 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The tunnel barrier layer 14 is made of a non-magnetic insulating metal oxide or nitride.

The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged. An MTJ element 1 which comprises a recording layer 15 having a variable magnetization direction and a reference layer 13 having an invariable magnetization direction for a predetermined write current can be achieved.

The cap layer 16 is a metal oxide layer having at least a thickness of 7 angstroms. The cap layer serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate away the cap layer. Typically, the recording layer contains a metal insertion layer in the middle, which serves as a good absorber for the Boron elements in the recording layer to achieve better epitaxial CoFe crystal grains, and consequentially the recoding layer has a lower damping constant than the original CoFeB recording layer.

First Embodiment

Figure 2A:
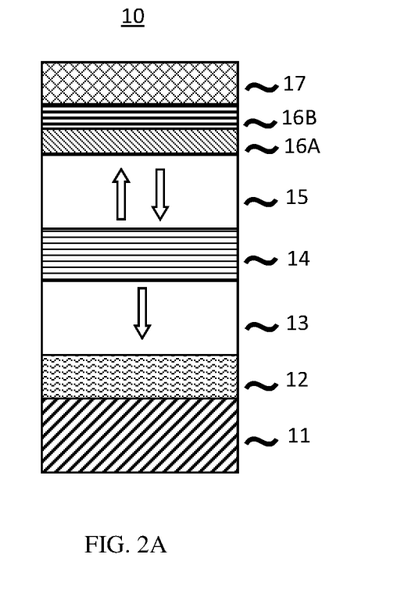
FIG. 2A is a cross-sectional view showing a schematic configuration of an MTJ element 10, according to the first embodiment.

FIG. 2A is a cross-sectional view showing a configuration of an MTJ element 10 as deposited according to the first embodiment. The MTJ element 10 is configured by stacking a bottom electrode 11, a seed layer 12, a reference layer 13, a tunnel barrier layer 14, a recording layer 15, a perpendicular coupling (P-C) layer 16A, a perpendicular anti-ferromagnetic (P-AFM) layer 16B and a cap layer 17 in this order from the bottom.

The reference layer 13 and the recording layer 15 are made of a ferromagnetic material, and have uni-axial magnetic anisotropy in a direction perpendicular to a film surfaces. Further, directions of easy magnetization of the reference layer 13 and the recording layer 15 are also perpendicular to the film surfaces. In another word, the MTJ element 1 is a perpendicular MTJ element in which magnetization directions of the reference layer 13 and the recording layer 15 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The tunnel barrier layer 14 is made of a non-magnetic insulating metal oxide or nitride.

The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged. An MTJ element 10 which comprises a recording layer 15 having a variable magnetization direction and a reference layer 13 having an invariable magnetization direction for a predetermined write current can be achieved.

The P-C layer 16A is a metal oxide or nitride layer having a stable crystalline phase and having at most a thickness of 7 angstroms. The P-C layer serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate away the P-C layer. More importantly, the P-C layer serves to introduce giant magnetic anisotropy energies (P-MAE) on the top surface of the recording layer 15 and the bottom surface of the P-AFM layer 16B, which further introduce RKKY coupling between the magnetic moment of the recording layer 15 and the P-MAE induced magnetic moment at the bottom of the P-AFM layer 16B, yielding a giant perpendicular magnetic anisotropy of the recording layer 15.

An example configuration of the MTJ element 10 will be described below. The reference layer 13 is made of CoFeB (around 1 nm)/W (around 0.2 nm)/Ru(around 0.5 nm)/Co (0.5 nm)/[Pt/Co]$_3$/Pt. The tunnel barrier layer 14 is made of MgO (around 1 nm). The recording layer 15 is made of CoFeB (around 0.6 nm)/W (0.3 nm)/CoFeB (around 1.55 nm). The C-P layer 16A is made of MgO (around 0.5 nm). The P-AFM layer 16B is made of Ru or RuO (around 2 nm). The cap layer 17 is made of Ru/Ta (around 10 nm). The seed layer 12 is made of Ta (around 20 nm)/Ru(around 20 nm)/Ta (around 20 nm). Each element written in the left side of "I" is stacked above an element written in the right side thereof.

Figure 2B:
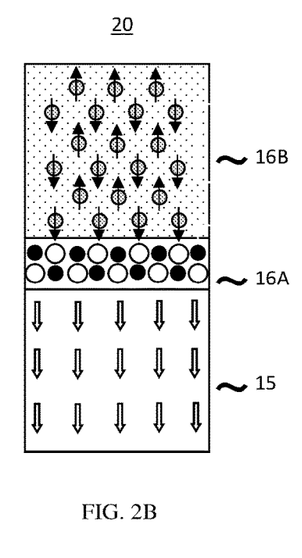
FIG. 2B is a cross-sectional view showing an illustration of P-MAE and RKKY coupling for transition atoms across the P-C layer in an MTJ element 20.

FIG. 2B is a cross-sectional view showing an illustration of P-MAE and RKKY coupling for transition atoms across the P-C layer in an MTJ element 20. In the P—C layer 16A, the thin MgO film has the Rocksalt crystalline structure having (001) orientation parallel to the surface, in which 0 sites are represented by big open circles and Mg sites are represented by small black circles. At the interface between the recording layer 15 and the P-C layer 16A, the Fe or Co atoms in the recording layer 15 attract to the O sites of MgO (001) surface of the P-C layer 16A after a thermal annealing process, generating magnetic anisotropy energy or a perpendicular anisotropy on the recording layer 15. As an example of the P-AFM layer 16B, which is made of a Ru or RuO layer, the magnetic disorder induced by an anti-ferromagnetic interaction among Ru atoms causes its AFM state. At the interface between the P-C layer 16A and the P-AFM layer 16B, as the Ru atoms attract to the O sites of MgO (001) surface of the P-C layer 16A, a layer P-MAE is achieved for the Ru atoms sitting on the top of the O sites of MgO (001) surface through a giant spin-orbit coupling (SOC) energy, a special ligand field and orbital multiplet effect. Magnetic moments of Fe or Co atoms with high spins on the top surface of the recording layer 15 and magnetic moments of Ru atoms with intermediate spins on the bottom surface of the P-AFM layer 16B are further coupled across the thin MgO film as its thickness is no more than 0.7 nm in RKKY mode. Detailed experimental data show that this RKKY coupling strength across the MgO P-C layer decreases with the MgO P-C layer thickness and becomes negligible when the MgO P-C layer thickness is more than 0.7 nm.

Figure 2C:
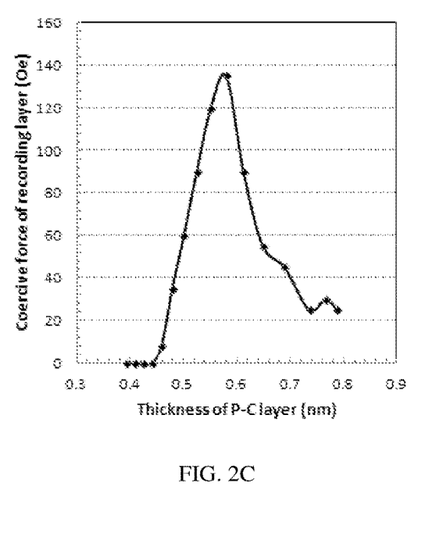
FIG. 2C is a set of experimental data showing the coercive force of the recording layer as a function of the P-C layer thickness in the first embodiment.

In one example of un-patterned MTJ film study in which the recording layer 15 is fixed to be CoFeB (0.6 nm)/W (0.3 nm)/CoFeB (1.55 nm) and the P-AFM layer is fixed to be Ru(2 nm), the MgO P-C layer thickness is varied from 0.4 nm to 0.8 nm in order to evaluate its impact on coercive force (Hc) of the recording layer. As shown in FIG. 2C, the Hc of the recording layer reaches its peak value of 135 Oe when the MgO P-C layer thickness is around 0.57 nm and becomes flat around 30 Oe when the MgO P-C layer thickness is more than 0.7 nm. By further engineering the P-AFM layer, it is found that the magnitude of Hc of the recording layer also depends upon the thickness of the P-AFM layer. The coercive force of the recording layer can readily reach more than 350 Oe.

Second Embodiment

Figure 3:
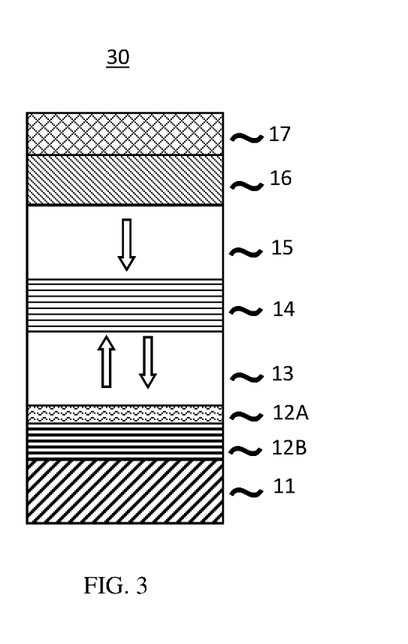
FIG. 3 is a cross-sectional view showing a configuration of an MTJ element 30 as deposited, according to the second embodiment.

FIG. 3 is a cross-sectional view showing an example configuration of the MTJ element 30 as deposited according to the second embodiment. As shown in FIG. 3, the reference layer 15 is made of Pt/[Co/Pt]n/Co (around 0.5 nm)/Ru(around 0.4-5 nm)/W (around 0.15 nm)/CoFeB (around 1 nm). The tunnel barrier layer 14 is made of MgO (around 1 nm). The recording layer 13 is made of CoFeB (around 1.2 nm). The C-P layer 12A is made of MgO (around 0.5 nm). The P-AFM layer 12B is made of Ru or RuO (around 3 nm). The cap layer 17 is made of Ta/Ir (around 10 nm). The seed layer 11 is made of Ta (around 20 nm)/Ru(around 20 nm)/Ta (around 20 nm). Each element written in the left side of "I" is stacked above an element written in the right side thereof.

The reference layer 15 and the recording layer 13 are made of a ferromagnetic material, and have uni-axial magnetic anisotropy in a direction perpendicular to a film surfaces. Further, directions of easy magnetization of the reference layer 15 and the recording layer 13 are also perpendicular to the film surfaces. In another word, the MTJ element 30 is a perpendicular MTJ element in which magnetization directions of the reference layer 15 and the recording layer 13 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The tunnel barrier layer 14 is made of a non-magnetic insulating metal oxide or nitride.

The recording layer 13 has a variable (reversible) magnetization direction. The reference layer 13 has an invariable (fixing) magnetization direction. The reference layer 15 is made of a ferromagnetic material having a perpendicular magnetic anisotropic energy which is sufficiently greater than the recording layer 13. This strong perpendicular magnetic anisotropy can be achieved by selecting a material, configuration and a film thickness. In this manner, a spin polarized current may only reverse the magnetization direction of the recording layer 13 while the magnetization direction of the reference layer 15 remains unchanged. An MTJ element 10 which comprises a recording layer 13 having a variable magnetization direction and a reference layer 15 having an invariable magnetization direction for a predetermined write current can be achieved.

The P-C layer 12A is a metal oxide or nitride layer having a stable crystalline phase and having at most a thickness of 7 angstroms. The P-C layer serves to introduce or improve perpendicular magnetic anisotropy of the recording layer 13. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate away the P-C layer. More importantly, the P-C layer serves to introduce giant magnetic anisotropy energies (P-MAE) on the bottom surface of the recording layer 13 and the top surface of the P-AFM layer 12B, which further introduce RKKY coupling between the magnetic moment of the recording layer 13 and the P-MAE induced magnetic moment at the bottom of the P-AFM layer 12B, yielding a giant perpendicular magnetic anisotropy of the recording layer 13.

Third Embodiment

Figure 4:
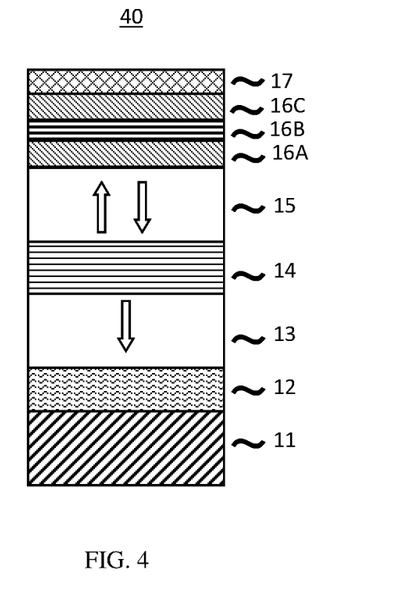
FIG. 4 is a cross-sectional view showing a configuration of an MTJ element 40 as deposited, according to the third embodiment.

FIG. 4 is a cross-sectional view showing a configuration of an MTJ element 10 as deposited according to the third embodiment. The MTJ element 10 is configured by stacking a bottom electrode 11, a seed layer 12, a reference layer 13, a tunnel barrier layer 14, a recording layer 15, a perpendicular coupling (P-C) layer 16A, a perpendicular anti-ferromagnetic (P-AFM) layer 16B, an enhancement layer 16C and a cap layer 17 in this order from the bottom.

Similar to the first embodiment, the P-C layer 16A is a metal oxide or nitride layer having a stable crystalline phase and having at most a thickness of 7 angstroms. The P-C layer 16A serves to introduce or improve perpendicular magnetic anisotropy of the recording layer 15. As an amorphous ferromagnetic material, like CoFeB, in the recording layer 15 is thermally annealed, a crystallization process occurs to form bcc CoFe grains having epitaxial growth with (100) plane parallel to surface of the tunnel barrier layer 14 and a perpendicular anisotropy is induced in the recording layer 15, as Boron elements migrate away the P-C layer 16A. More importantly, the P-C layer 16A serves to introduce giant magnetic anisotropy energies (P-MAE) on the top surface of the recording layer 15 and the bottom surface of the P-AFM layer 16B, which further introduce RKKY coupling between the magnetic moment of the recording layer 15 and the P-MAE induced magnetic moment at the bottom of the P-AFM layer 16B, yielding a giant perpendicular magnetic anisotropy of the recording layer 15.

An enhancement layer 16C is deposited directly on top of the P-AFM layer 16B to better align magnetic moments in the P-AFM layer along the vertical direction. Although magnetic moments in the P-AFM layer 16B as deposited are in disorder, sandwiching the P-AFM layer 16B between the P-C layer 16A and the enhancement layer 16C would improve magnetic moment orientations of atoms in the P-AFM layer 16B after a thermal anneal process.

Fourth Embodiment

Similar to above embodiments, the same principle can be adopted in a reverse-structured magnetoresistive element.

Figure 5:
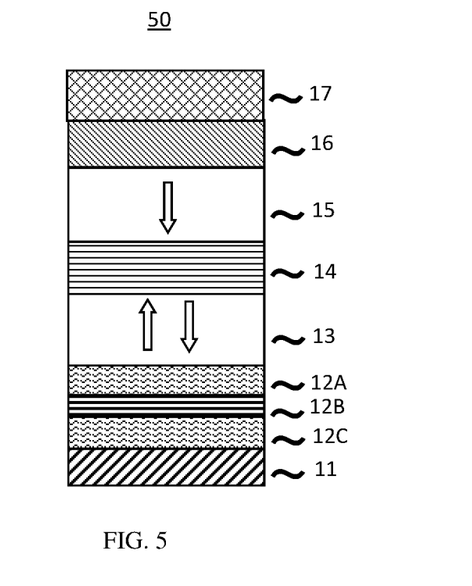
FIG. 5 is a cross-sectional view showing a configuration of an MTJ element 50 as deposited, according to the fourth embodiment.

As shown in FIG. 5, the reference layer 15 is made of Pt/[Co/Pt]n/Co (around 0.5 nm)/Ru(around 0.4-5 nm)/W (around 0.15 nm)/CoFeB (around 1 nm). The tunnel barrier layer 14 is made of MgO (around 1 nm). The recording layer 13 is made of CoFeB (around 1.2 nm). The C-P layer 12A is made of MgO (around 0.5 nm). The P-AFM layer 12B is made of Ru or RuO (around 3 nm). The enhancement layer 12C is made of MgO (around 0.5 nm). The cap layer 17 is made of Ta/Ir (around 10 nm). The seed layer 11 is made of Ta (around 20 nm)/Ru(around 20 nm)/Ta (around 20 nm). Each element written in the left side of "/" is stacked above an element written in the right side thereof.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a reference layer having magnetic anisotropy and having an invariable magnetization direction;
   a tunnel barrier layer provided on a surface of the reference layer;
   a recording layer provided on a surface of the tunnel barrier layer, which is opposite to a surface of the tunnel barrier layer where the reference layer is provided, and having a variable magnetization direction;
   a perpendicular coupling (P-C) layer provided on a surface of the recording layer, which is opposite to a surface of the recording layer where the tunnel barrier layer is provided;
   a perpendicular anti-ferromagnetic (P-AFM) layer provided on a surface of the P-C layer, which is opposite to a surface of the P-C layer where the recording layer is provided wherein at least the portion of the P-AFM layer interfacing to the P-C layer contains an anti-ferromagnetic material;
   a cap layer provided on a surface of the P-AFM layer, which is opposite to a surface of the P-AFM layer where the P-C layer is provided;
   and an upper-contact multilayer provided on the most top of above said layers, comprising a buffer layer and a photoresist layer for further photo-lithographic processes of a magnetoresistive element.

2. The element of claim 1, wherein the perpendicular coupling (P-C) layer is a single layer of metal oxide or metal nitride, preferred to be MgO, ZnO, MgZnO, ZrO, MgZrO, MgN.

3. The element of claim 1, wherein the perpendicular coupling (P-C) layer is a single layer of metal halides, preferred to be NaBr, NaF, NaCl, NaI, KBr, KF, KCl.

4. The element of claim 1, wherein the thickness of the perpendicular coupling (P-C) layer is sufficiently large to separate the recoding layer and the P-AFM layer, and is sufficiently thin to have magnetic coupling between magnetic moments of the recording layer atoms and magnetic moments of the P-AFM layer atoms which are in contact with the P-C layer and produce a giant perpendicular magnetic anisotropy of the recording layer, preferred to be between 5 angstroms and 6.5 angstroms.

5. The element of claim 1, wherein the perpendicular anti-ferromagnetic (P-AFM) layer comprises a single layer, bilayer or multilayer of transition metal, preferred to be Ru, Os, Tc, Re, Co, Ru/Co, Os/Co, Tc/Co, Re/Co, Zn, Cd.

6. The element of claim 1, wherein the perpendicular anti-ferromagnetic (P-AFM) layer comprises a single layer, bilayer or multilayer of transition metal alloy having HCP crystalline structure, preferred to be RuFe, RuCo, RuMn, OsFe, OsCo, OsMn, TcFe, TcCo, TcMn, ReFe, ReCo, ReMn, CoMn, NiMn, IrMn.

7. The element of claim 1, wherein the perpendicular anti-ferromagnetic (P-AFM) layer comprises a single layer, bilayer or multilayer of transition metal oxide or nitride or sulfide, preferred to be RuO, OsO, TcO, ReO, CoO, NiO, RuN, OsN, TcN, ReN, RuS, OsS, TcS, ReS.

8. The element of claim 1, wherein the perpendicular anti-ferromagnetic (P-AFM) layer is preferred to be in the range from 10 angstroms to 50 angstroms.

9. The magnetoresistive element according to the claim 1, further comprising an enhancement layer which is inserted between the perpendicular anti-ferromagnetic (P-AFM) layer and the cap layer.

10. The element of claim 9, wherein the enhancement layer is a single layer of metal oxide or metal nitride, preferred to be MgO, ZnO, MgZnO, ZrO, MgZrO, MgN.

11. The element of claim 9, wherein the enhancement layer is preferred be around 5 angstroms thick.

12. The element of claim 1, wherein the recording layer is a single ferromagnetic Boron alloy layer, preferred to be CoFeB or CoB, FeB, the B composition percentage is between 10%-30% with a preferred value of 15%.

13. The element of claim 1, wherein the recording layer is a multi-layer comprising at least a ferromagnetic Boron alloy layer, preferred to be CoFeB or CoB, FeB, the Boron composition percentage is between 10%-30% with a preferred value of 10%.

14. The element of claim 13, wherein the recording layer has a insertion layer of transition metal, preferred to be W, Mo, Ta, Hf, Nb, Zr.

15. A magnetic random memory comprises a memory cell which comprises magnetoresistive element according to the claim 1.

16. The magnetic random memory according to the claim 15, further comprising an upper electrode and a lower electrode which sandwich the memory cell.

17. The magnetic random memory according to the claim 15, further comprising a write circuit which bi-directionally supplies a current to the magnetoresistive element.

18. The magnetic random memory according to the claim 15, wherein the memory cell comprises a select transistor electrically connected between the magnetoresistive element and the write circuit.

* * * * *